US009330776B2

(12) United States Patent
Huynh et al.

(10) Patent No.: US 9,330,776 B2
(45) Date of Patent: May 3, 2016

(54) HIGH VOLTAGE STEP DOWN REGULATOR WITH BREAKDOWN PROTECTION

(71) Applicant: SanDisk Technologies Inc., Plano, TX (US)

(72) Inventors: Jonathan Huynh, San Jose, CA (US); Jongmin Park, Cupertino, CA (US); Trung Pham, Fremont, CA (US)

(73) Assignee: SanDISK Technologies Inc., Pano, TX (US)

( * ) Notice: Subject to any disclaimer, the term of this patent is extended or adjusted under 35 U.S.C. 154(b) by 0 days.

(21) Appl. No.: 14/459,795

(22) Filed: Aug. 14, 2014

(65) Prior Publication Data

US 2016/0049206 A1    Feb. 18, 2016

(51) Int. Cl.
| | |
|---|---|
| *G11C 16/28* | (2006.01) |
| *G11C 16/30* | (2006.01) |
| *G11C 16/10* | (2006.01) |
| *G11C 16/26* | (2006.01) |
| *H02M 3/158* | (2006.01) |

(52) U.S. Cl.
CPC ............. *G11C 16/30* (2013.01); *G11C 16/10* (2013.01); *G11C 16/26* (2013.01); *H02M 3/158* (2013.01)

(58) Field of Classification Search
CPC .......... G11C 16/30; G11C 16/10; G11C 16/26
USPC ............. 365/185.21, 185.17, 185.18, 185.19, 365/226; 327/540
See application file for complete search history.

(56) References Cited

U.S. PATENT DOCUMENTS

| | | | |
|---|---|---|---|
| 4,161,633 | A | 7/1979 | Treiber |
| 4,580,067 | A | 4/1986 | Proebsting |
| 4,954,731 | A | 9/1990 | Dhong et al. |
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |

(Continued)

FOREIGN PATENT DOCUMENTS

| | | |
|---|---|---|
| EP | 0 475 407 | 3/1992 |
| JP | 02 034022 A | 2/1990 |

(Continued)

OTHER PUBLICATIONS

Feng Pan., "Charge Pump Circuit Design," McGraw-Hill, 2006, 26 pages.

(Continued)

*Primary Examiner* — Thao H Bui
*Assistant Examiner* — Alfredo Bermudez Lozada
(74) *Attorney, Agent, or Firm* — Davis Wright Tremaine LLP

(57) ABSTRACT

A high voltage step regulator, such as would be used to provide a regulated low voltage (on the order of a few volts) from a high voltage external supply (e.g. 12V), is presented. To protect the output transistor, through which the output is provided from the input, from breakdown, a depletion type device is connected between the supply and the output transistor. The control gate of the depletion device is then connected to the output level of the regulator. This reduces the voltage drop across the output transistor, helping to avoid violating design rules (EDR) on how great a voltage differential can be placed across the output transistor. Examples of applications for such a circuit are for various operating voltages on a non-volatile memory chip operating with a high voltage power supply.

22 Claims, 12 Drawing Sheets

(56) References Cited

U.S. PATENT DOCUMENTS

| | | | |
|---|---|---|---|
| 5,343,063 A | 8/1994 | Yuan et al. | |
| 5,436,587 A | 7/1995 | Cernea | |
| 5,512,845 A | 4/1996 | Yuh | |
| 5,570,315 A | 10/1996 | Tanaka et al. | |
| 5,595,924 A | 1/1997 | Yuan et al. | |
| 5,661,053 A | 8/1997 | Yuan | |
| 5,723,985 A | 3/1998 | Van Tran et al. | |
| 5,768,192 A | 6/1998 | Eitan | |
| 5,790,453 A | 8/1998 | Chevallier | |
| 5,903,495 A | 5/1999 | Takeuchi et al. | |
| 5,912,838 A | 6/1999 | Chevallier | |
| 5,940,333 A | 8/1999 | Chung | |
| 5,966,331 A | 10/1999 | Shiau et al. | |
| 6,011,725 A | 1/2000 | Eitan | |
| 6,020,778 A | 2/2000 | Shigehara et al. | |
| 6,044,012 A | 3/2000 | Rao et al. | |
| 6,046,935 A | 4/2000 | Takeuchi et al. | |
| 6,078,518 A | 6/2000 | Chevallier | |
| 6,154,085 A | 11/2000 | Ramakrishnan | |
| 6,166,982 A | 12/2000 | Murray et al. | |
| 6,169,432 B1 | 1/2001 | Sharpe-Geisler | |
| 6,222,762 B1 | 4/2001 | Guterman et al. | |
| 6,242,962 B1 | 6/2001 | Nakamura | |
| 6,351,158 B1 | 2/2002 | Shearon et al. | |
| 6,359,496 B1 | 3/2002 | Steinhagen | |
| 6,370,075 B1 | 4/2002 | Haeberli et al. | |
| 6,483,366 B1 | 11/2002 | Ho | |
| 6,492,860 B1 | 12/2002 | Ramakrishnan | |
| 6,556,465 B2 | 4/2003 | Haeberli et al. | |
| 6,696,880 B2 | 2/2004 | Pan et al. | |
| 6,717,851 B2 | 4/2004 | Mangan et al. | |
| 6,760,262 B2 | 7/2004 | Haeberli et al. | |
| 6,922,096 B2 | 7/2005 | Cernea | |
| 7,030,683 B2 | 4/2006 | Pan et al. | |
| 7,053,689 B2 | 5/2006 | Kim | |
| 7,135,910 B2 | 11/2006 | Cernea | |
| 7,272,046 B2 * | 9/2007 | Tanzawa | G11C 8/06 365/185.18 |
| 7,368,979 B2 | 5/2008 | Govindu et al. | |
| 7,400,171 B1 | 7/2008 | Montazer | |
| 7,492,206 B2 | 2/2009 | Park et al. | |
| 7,515,503 B2 | 4/2009 | Lee et al. | |
| 7,554,311 B2 | 6/2009 | Pan | |
| 7,592,858 B1 | 9/2009 | Jung | |
| 7,609,554 B2 | 10/2009 | Tanzawa | |
| 7,795,952 B2 | 9/2010 | Lui et al. | |
| 7,796,437 B2 * | 9/2010 | Cazzaniga | G11C 5/147 365/185.18 |
| 7,816,969 B2 | 10/2010 | Yoo | |
| 8,004,340 B2 | 8/2011 | Guo et al. | |
| 8,098,088 B1 | 1/2012 | Sutandi et al. | |
| 8,106,701 B1 | 1/2012 | Huynh et al. | |
| 8,294,509 B2 | 10/2012 | Pan et al. | |
| 8,305,807 B2 | 11/2012 | Shah et al. | |
| 8,339,185 B2 | 12/2012 | Cazzaniga et al. | |
| 2006/0114737 A1 | 6/2006 | Terasawa et al. | |
| 2006/0133149 A1 * | 6/2006 | Chae | G11C 5/145 365/185.18 |
| 2007/0109862 A1 | 5/2007 | Kim | |
| 2007/0126494 A1 | 6/2007 | Pan | |
| 2007/0133300 A1 | 6/2007 | Tanzawa | |
| 2007/0139077 A1 | 6/2007 | Park et al. | |
| 2007/0139099 A1 | 6/2007 | Pan | |
| 2007/0268748 A1 | 11/2007 | Lee et al. | |
| 2007/0268774 A1 | 11/2007 | Lee et al. | |
| 2008/0198667 A1 | 8/2008 | Hosomura et al. | |
| 2009/0058506 A1 | 3/2009 | Nandi et al. | |
| 2009/0058507 A1 | 3/2009 | Nandi et al. | |
| 2009/0058508 A1 | 3/2009 | Lin | |
| 2009/0097312 A1 | 4/2009 | Binboga | |
| 2009/0153230 A1 | 6/2009 | Pan et al. | |
| 2009/0153232 A1 | 6/2009 | Fort et al. | |
| 2009/0302930 A1 | 12/2009 | Pan et al. | |
| 2009/0315616 A1 | 12/2009 | Nguyen et al. | |
| 2009/0322413 A1 | 12/2009 | Huynh et al. | |
| 2010/0019832 A1 | 1/2010 | Pan | |
| 2010/0067300 A1 | 3/2010 | Nakamura | |
| 2010/0080063 A1 | 4/2010 | Nakagawa | |
| 2010/0289465 A1 * | 11/2010 | Elran | 323/281 |
| 2010/0309720 A1 | 12/2010 | Liu et al. | |
| 2011/0018615 A1 | 1/2011 | Pan | |
| 2014/0169095 A1 | 6/2014 | Avila et al. | |
| 2014/0211553 A1 * | 7/2014 | Lai | G11C 29/025 365/163 |

FOREIGN PATENT DOCUMENTS

| | | |
|---|---|---|
| JP | 3-41694 | 2/1991 |
| JP | 9-139079 | 3/1997 |
| JP | 11-126478 | 5/1999 |

OTHER PUBLICATIONS

Pylarinos et al., "Charge Pumps: An Overview," Department of Electrical and Computer Engineering, University of Toronto, www.eecg.toronto,edu/~kphang/ece1371/chargepumps.pdf.

U.S. Appl. No. 13/927,659, entitled "System for Maintaining Back Gate Threshold Voltage in Three Dimensional NAND Memory," filed Jun. 26, 2013, 41 pages.

U.S. Appl. No. 13/925,662, entitled "High Capacity Select Switches for Three-Dimensional Structures," filed Jun. 24, 2013, 36 pages.

* cited by examiner

Programming into four states represented by a 2-bit code

HIGH VOLTAGE STEP DOWN REGULATOR WITH BREAKDOWN PROTECTION

BACKGROUND

This application relates to high voltage step down voltage regulators, such as could be used in the operation of re-programmable non-volatile memory systems, and to techniques for protecting such regulator circuits from breakdown.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A first set of aspects concern a high voltage step-down regulator circuit to provide a regulated low voltage level from a high voltage supply level. A high voltage output transistor is connected between the high voltage supply level and an output node. The high voltage output transistor is connected to the high voltage supply level through a depletion device, wherein the control gate of the depletion device is connected to the output node, thereby reducing the voltage drop across the high voltage output transistor. Supply control circuitry is connected to receive feedback from the output node and set the voltage level on the control gate of the high voltage output transistor to provide the regulated low voltage level on the output node based upon the feedback.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
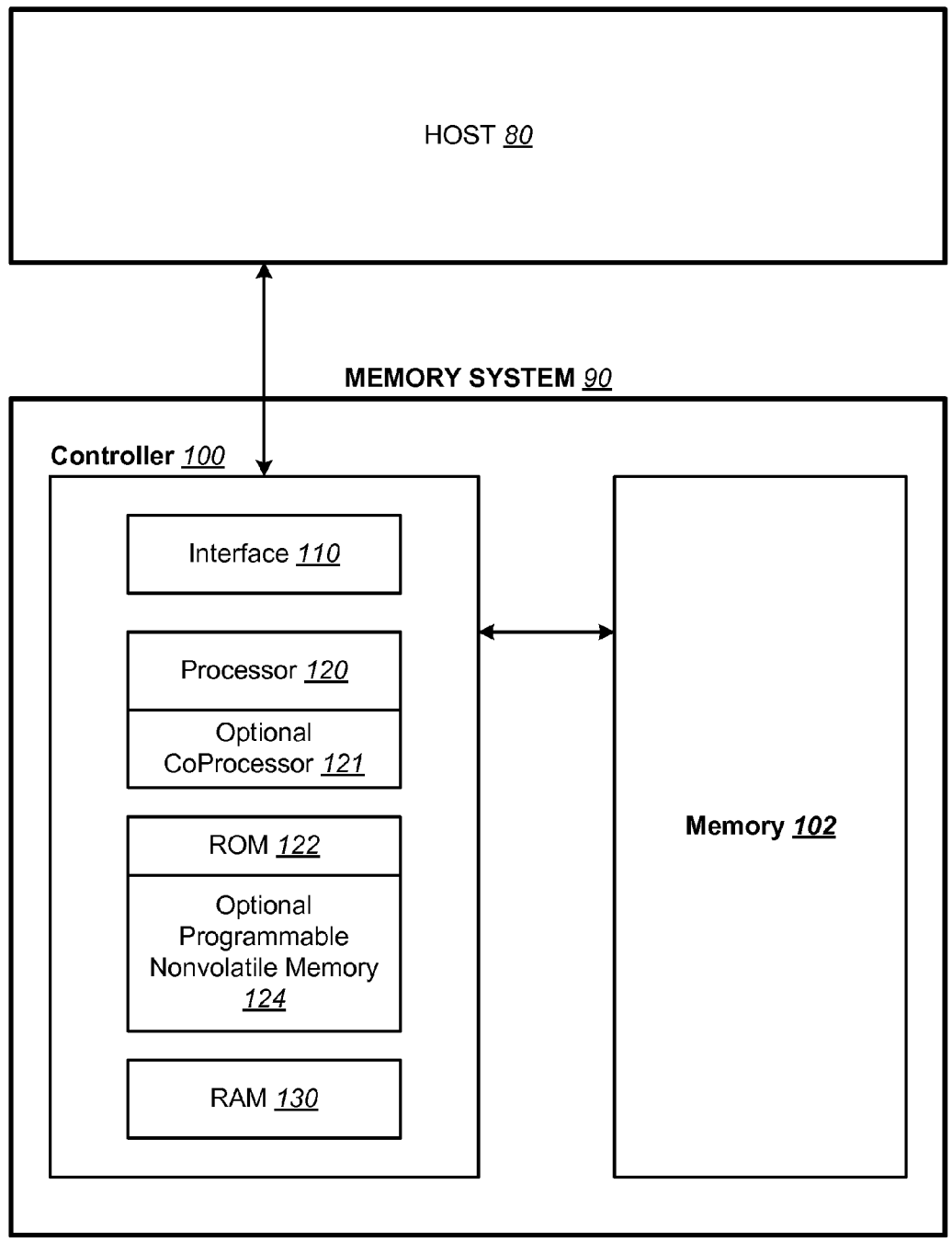
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Structure

Figure 2:
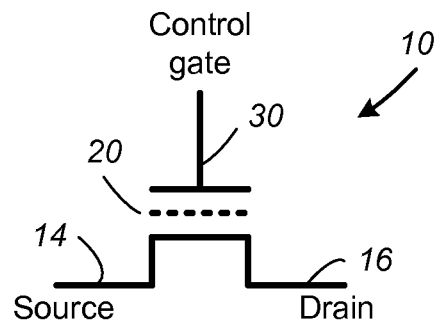
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
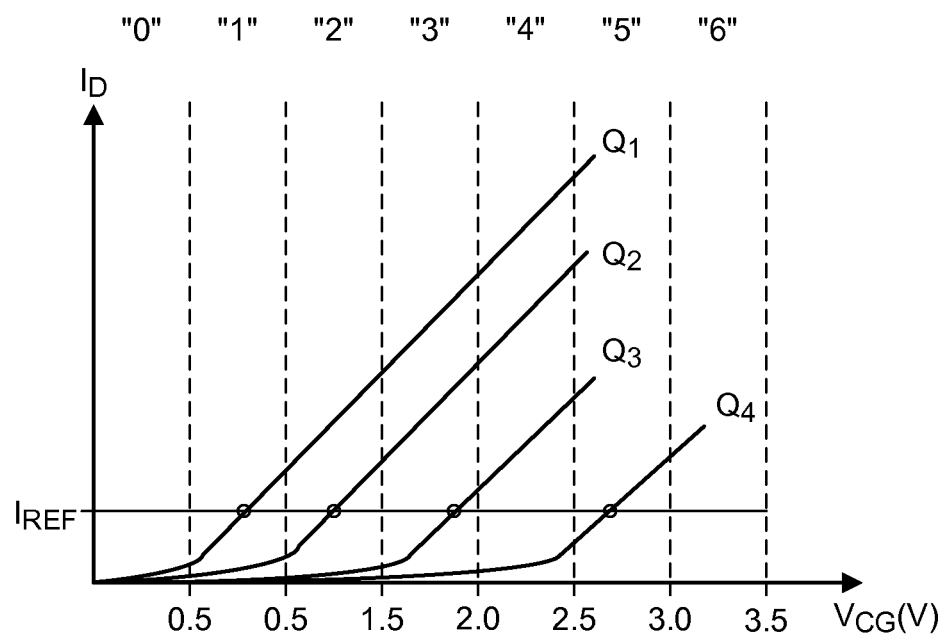
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
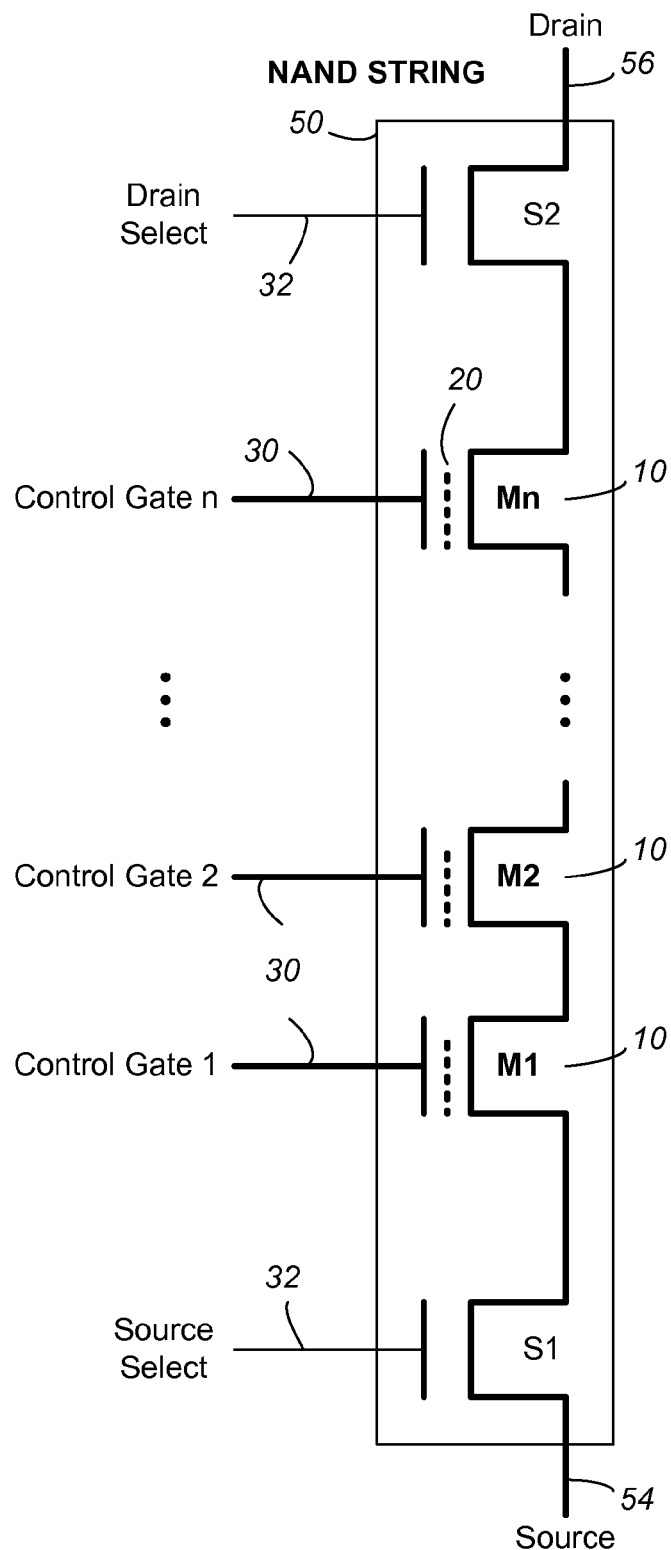
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
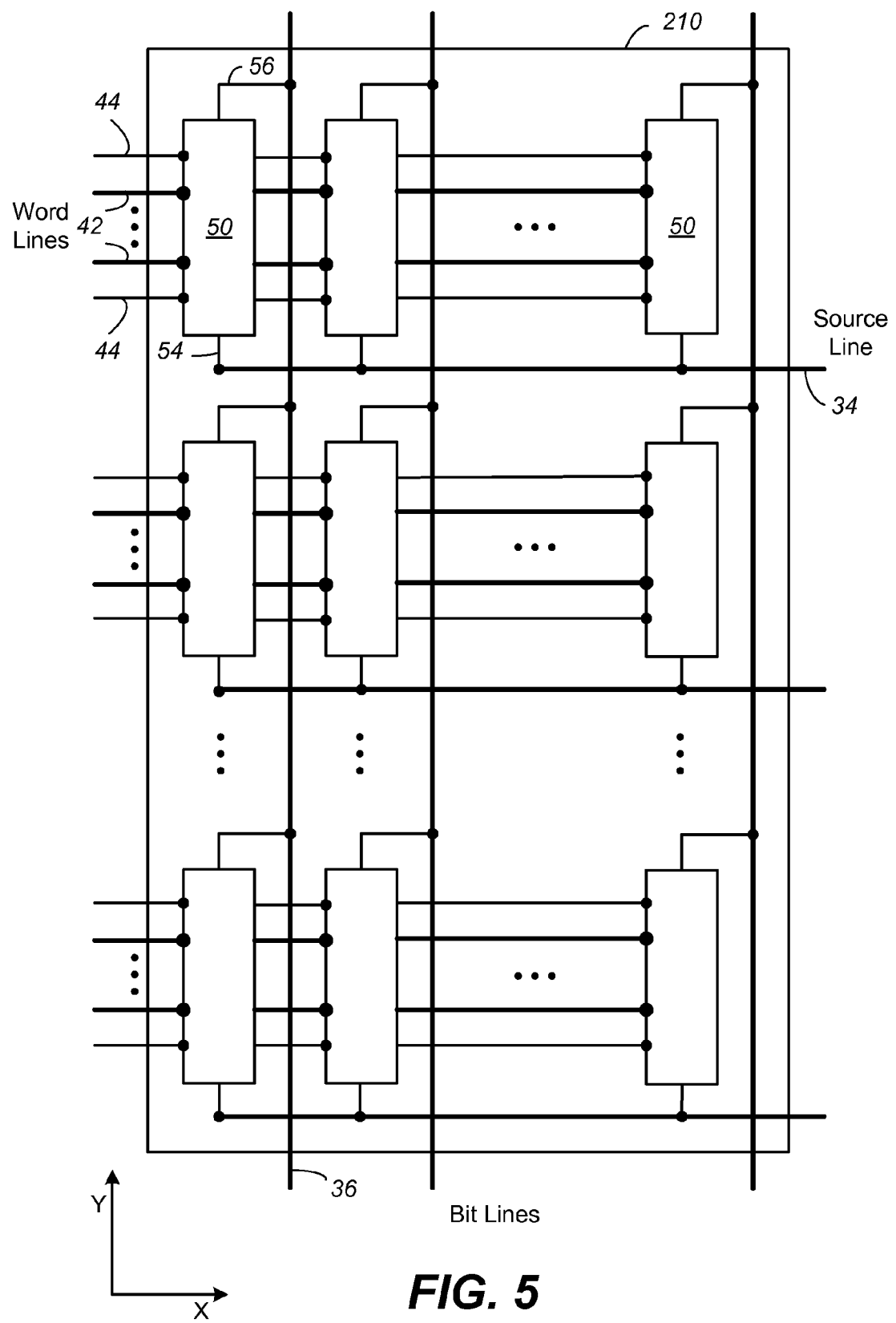
FIG. 5 illustrates an example of a NAND array 210 of memory cells, constituted from NAND strings 50 such as that shown in FIG. 4.
Figure 6:
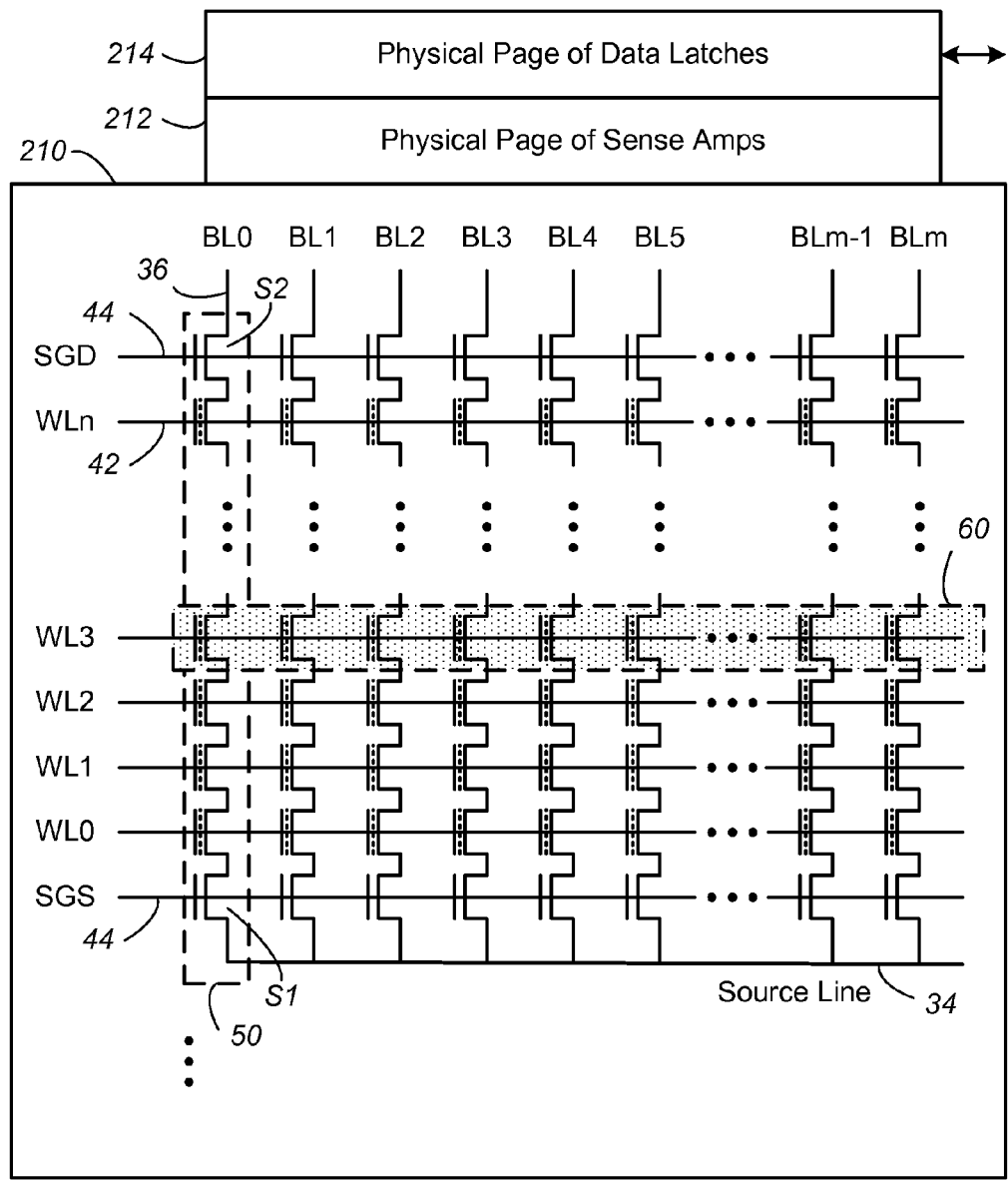
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
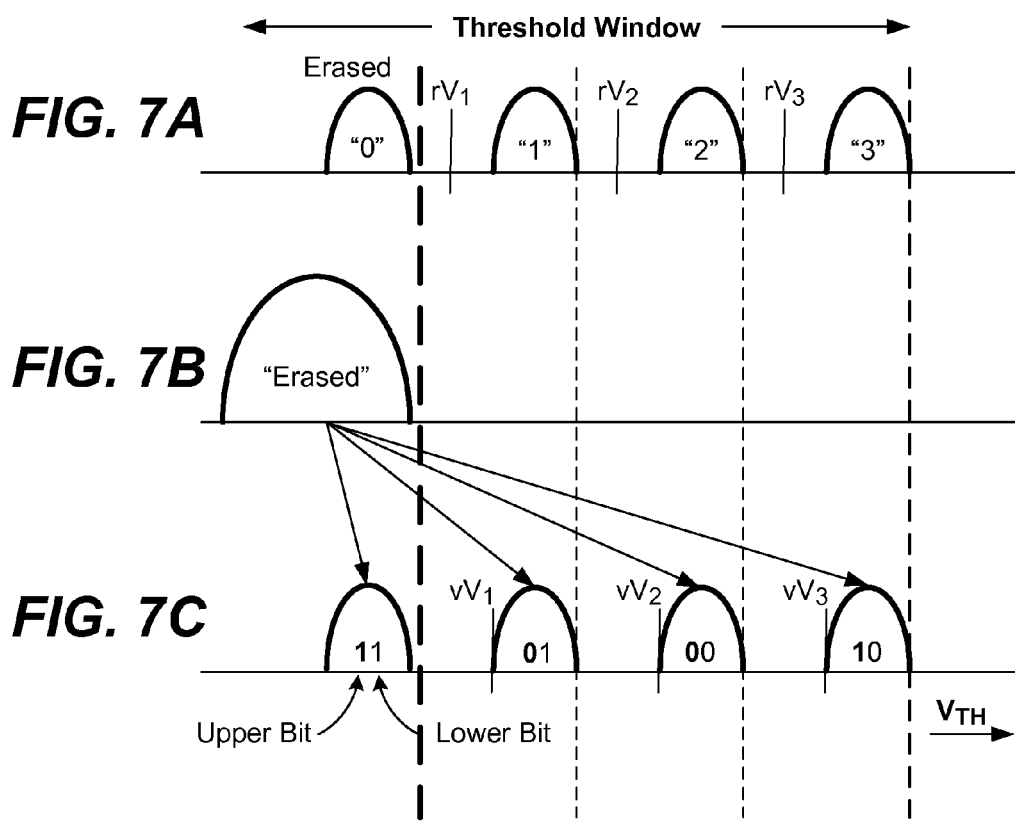
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8:
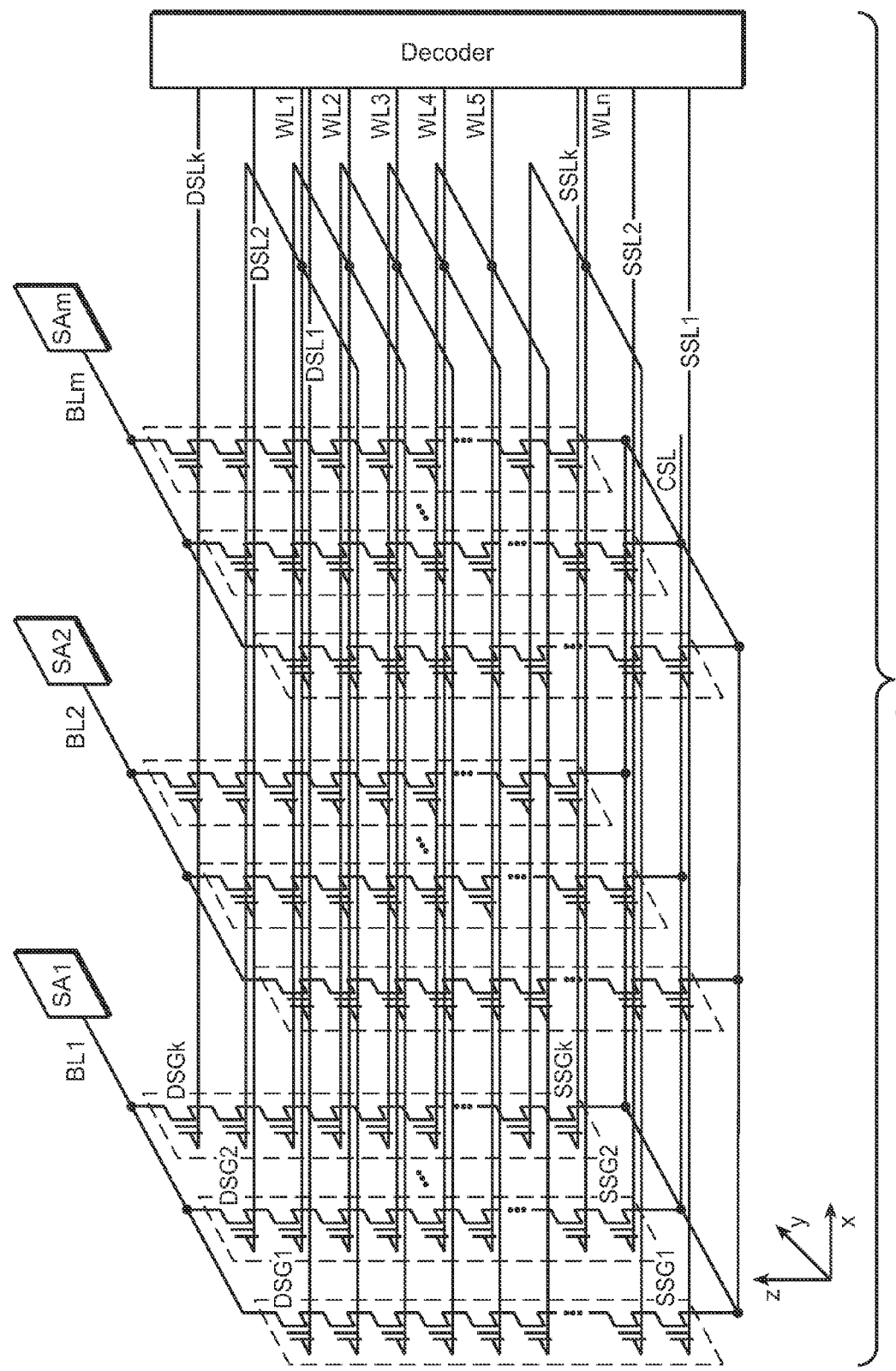
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-m, each run across the top to an associated sense amp SA1-m. The word lines, WL1-n, and source and select lines SSL1-n and DSL1-n, then run in x direction, with the NAND string connected at bottom to a common source line CSL.

Figure 9:
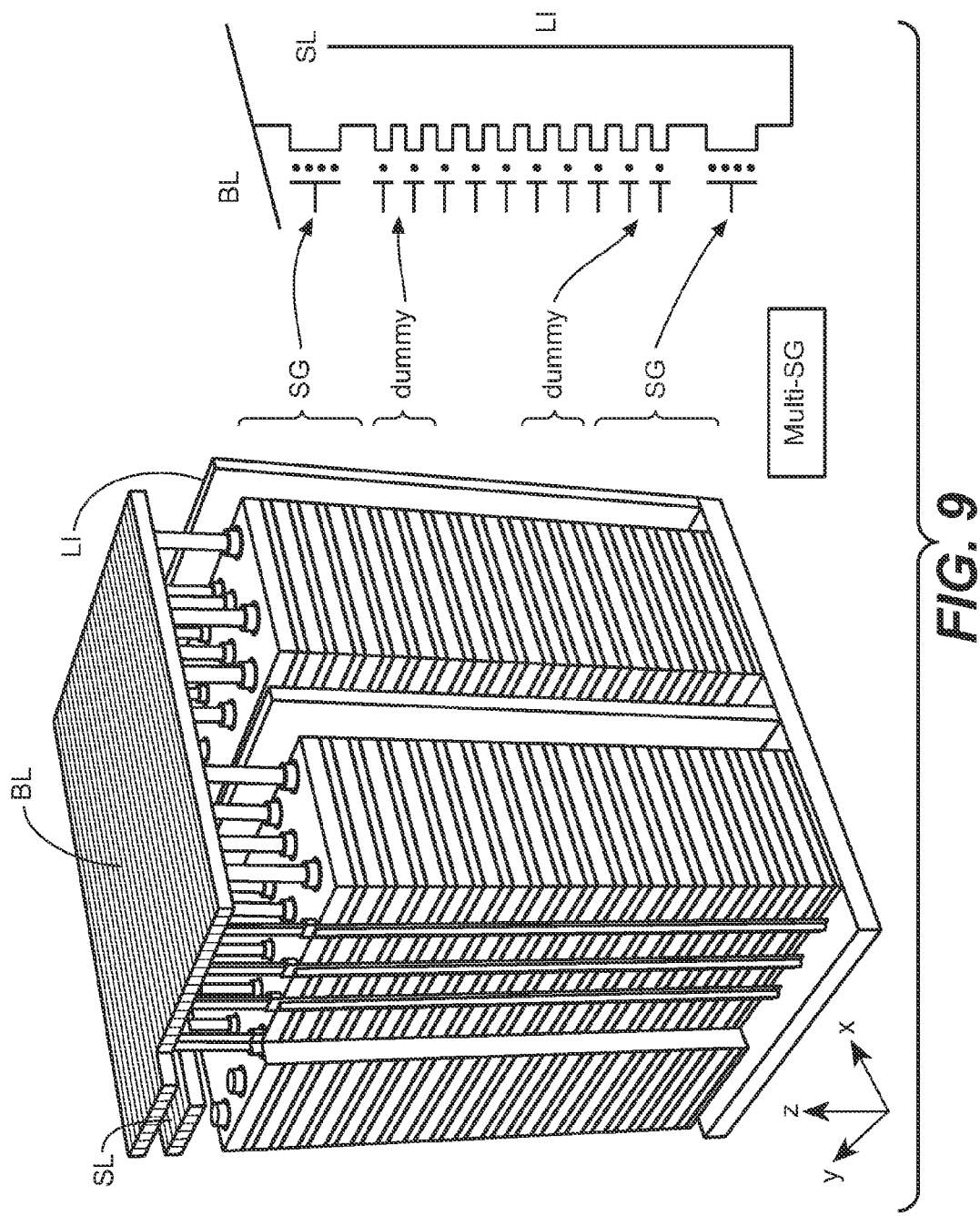
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up, such as is described in U.S. patent application Ser. No. 13/927,659, filed on Jun. 26, 2013.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted, aspects of which are described in US patent publication number 2014-0169095. This exemplary embodiment also includes several dummy cells at the ends that are not used to store user data, as their proximity to the select gates makes them more prone to disturbs.

Figure 10:
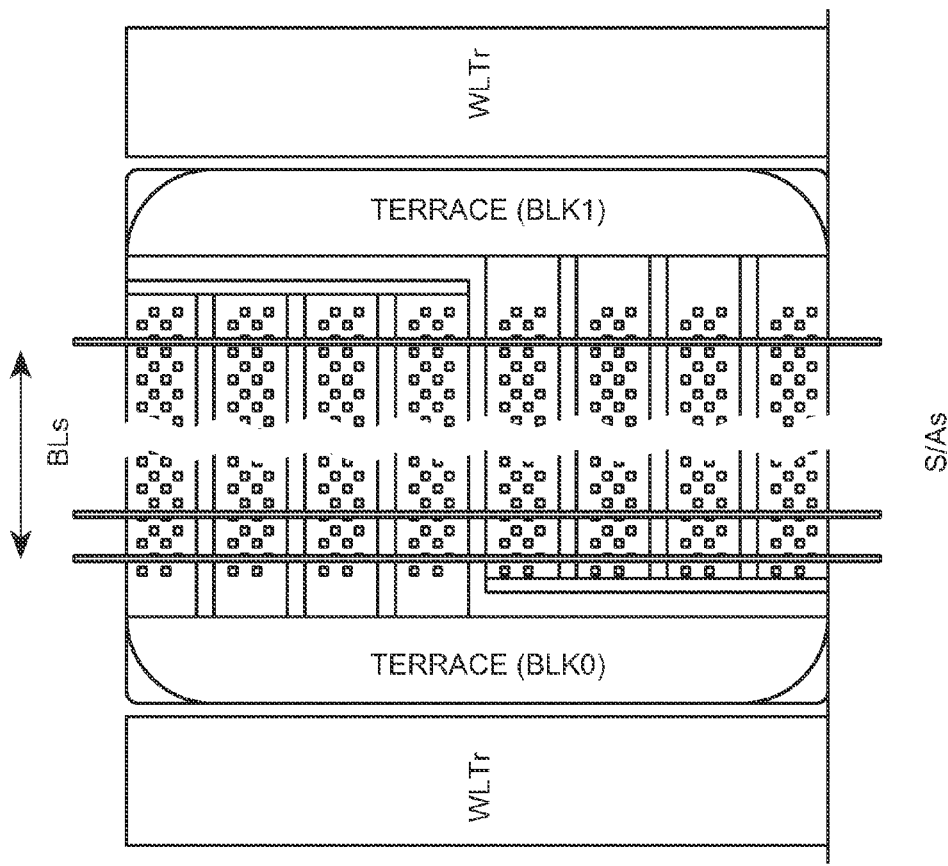

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
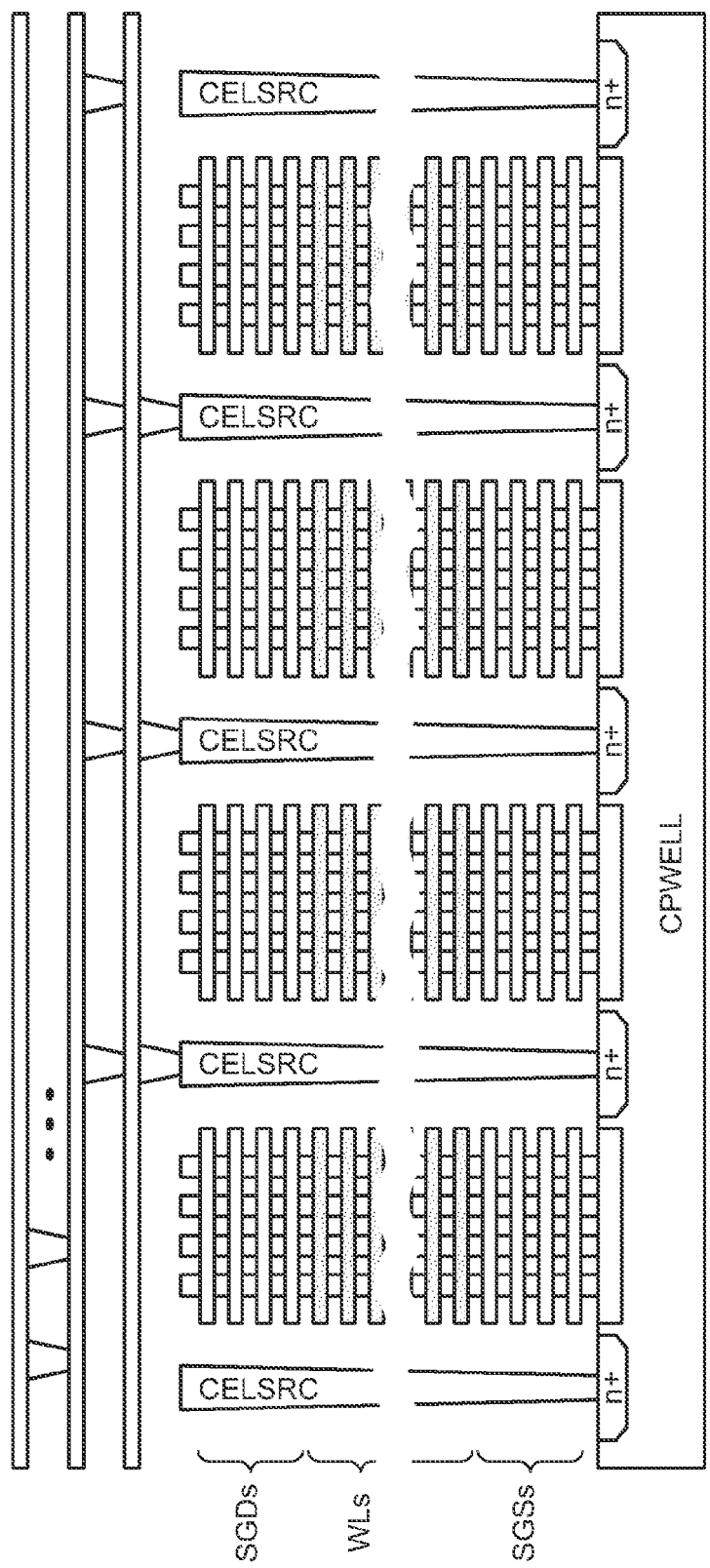

FIG. 11 shows a side view of one block, again with four fingers. In this exemplary embodiment, the select gates SOD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
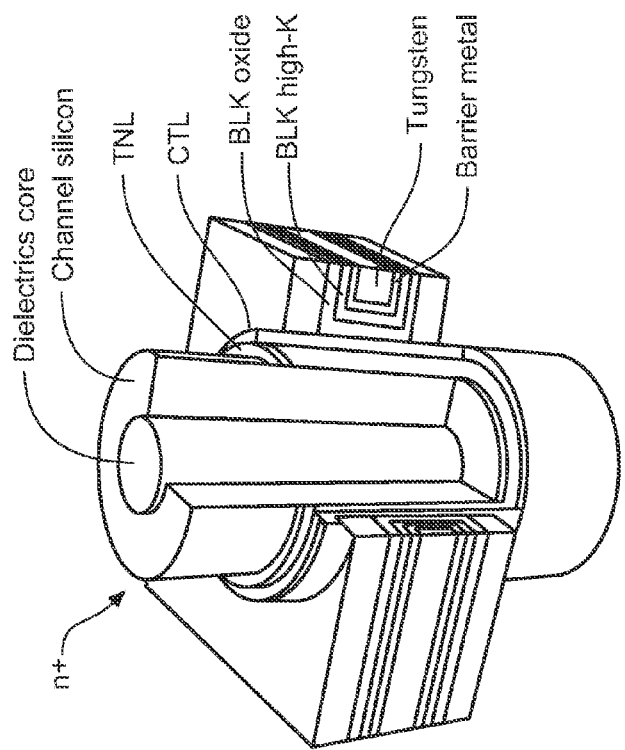

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

High Voltage Step Down Regulators

Memory circuits, such as those describe above, typically use a number of different regulated voltages levels in their operation. For example, in the NAND type circuits described above, in addition to the voltages applied to selected word lines during sensing operations, various voltages are applied to non-selected word lines and select gates during sensing and programming operations. In addition, bit lines, sense amps, well structures and other various bias levels, as well as the high voltages used in programming and erase operations. These levels are typically generated on the memory device from an external supply levels. In many applications of non-volatile memory, such the memory cards or embedded memory used on portable devices, the external supply level will often a low voltage (e.g., ~3V), with the higher voltage levels being generated through use of charge pump circuits. In more recent application of such memory circuits, such as solid state drives (SSDs) or enterprise level memory systems, it is more common to have a high voltage supply level (e.g. ~12V) available.

For NAND and other memory technologies, power saving and usage play an important role. In the absent of high supply level VPP pin on the memory chip, charge pumps are needed to generate high supply voltages for peripheral circuits as well as biasing memory cells for different operations. Consequently, the inclusion on the memory chip of a high supply level pin (such as a VPP 12V supply pin) can be used for the purpose of power saving as these higher levels no longer need to generated on-chip. To simplify design and reduce ripples, high voltage step down regulator can then be used to generate lower supply levels such as for various word line voltages. A typical way to provide such a step down regulator is to use a high voltage PFET device as a driver, but, given the lower voltage levels needed in applications such as NAND memories, this can run into limitations imposed by design rules for such devices.

Figure 13:
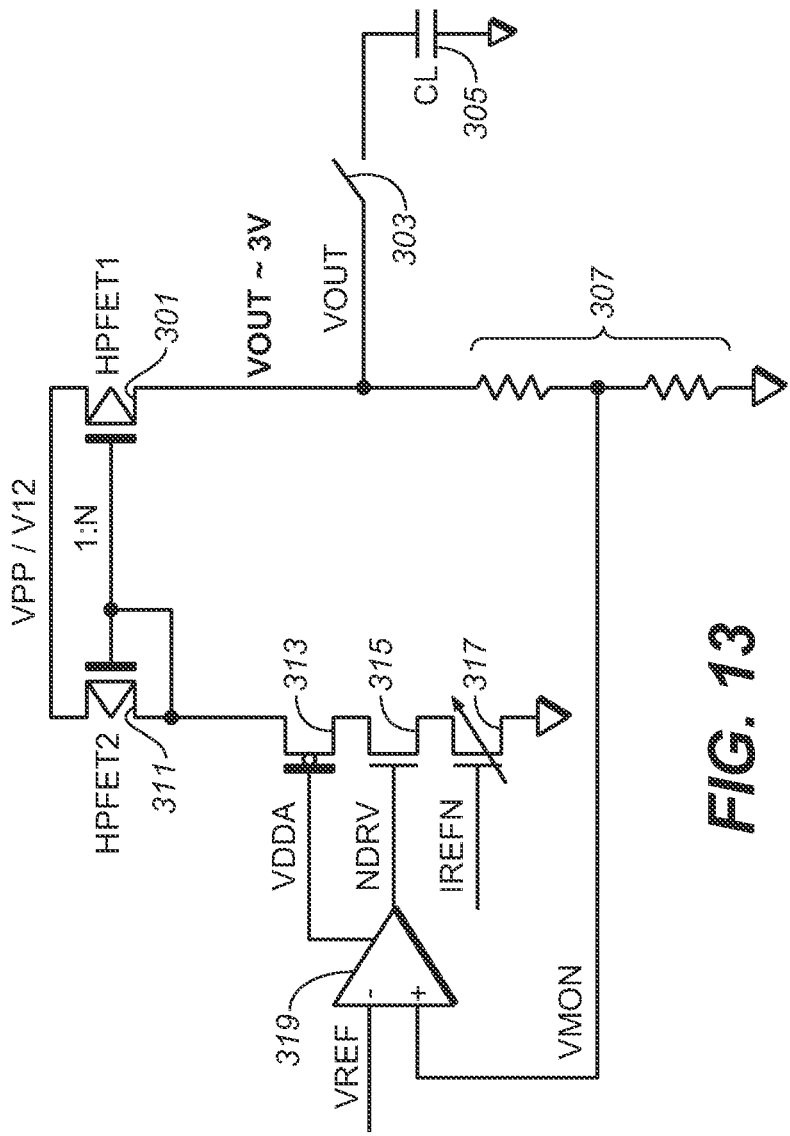
FIG. 13 illustrates an example of a high voltage step-down regulator.

FIG. 13 shows an example of a high voltage step down regulator, where a supply level VPP of 12V is used generate a lower, regulated voltage level VOUT. The output VOUT can then be supplied through a switch 303 to a capacitive load CL 305. For example, the load could be word lines of a memory array and the switch would then correspond to the word line decoding circuitry. The high voltage device HPFET1 301 is used to drive the load. The output VOUT is also connected to ground through a voltage divider 307, were feedback is taken from a node at a level VMON of the divider. Here a resistive divider is used, but other arrangement, such as incorporating capacitances, can also be used, depending on the application. The level VMON is then used as feedback to set the control gate level on HPFET 301.

VMON is used as an input to the op-amp 319 that has a reference level VREF as is other input. The output NDRV of op-amp 319 is connected the control gate of the transistor 315, where the transistor 315 is connected in series with the high voltage HPFET2 311 between the supply level VPP and ground. HPFET2 311 is connected in current mirror arrangement with HPFET1 301, their gates being commonly connected to the node below HPFET2 311. Due to the voltage difference between HPFET2 311 and transistor 315, a high voltage NMOS 313 is placed in between to protect the device 315, where the gate is set at an internal analog supply level VDDA. As HPFET1 301 is used to drive the load, while HPFET2 311 is only used in setting the levels, HPFET 2 can be sized smaller, here by a ratio of 1:N. Transistor 315 is connected to ground though a transistor 317 that acts as an adjustable current sink by trimming the value of the gate voltage IREFN.

In a design such a FIG. 13, the output values are limited as, for a supply level of VPP=12V, VOUT needs to be higher than 4V to avoid violating the design rules (EDR) on how great a voltage differential can be placed across the terminals of a HPFET. More specifically, in each of Vds, Vgs, and Vgd should be less than, say, 8V for typical implementation. As many of the voltage levels needed on memory circuit are on the order of a few volts (e.g. ~3V), this will result in a Vsd of over 8V resulting in an EDR issue.

One way lessen the voltage drop across HPFET1 301 would be to place another PMOS device below each of HPFET1 301 and HPFET2 311, so that the drop from VPP to VOUT be split between HPFET1 301 and this additional device. For example, the gates of these two devices could be commonly set at 4V for a VPP of 12V, so that the drop across HPFET1 301 could be kept under 8V and provide the need high voltage protection for the HPFET driving the load. However, this would slow down ramp up (recovery) at the output. This could be improved taking the gate voltage on these intermediary device low during ramp up, and then toggling them high, but the timing of the toggling can be tricky as if gate voltage toggles L→H too early, the ramp up (recovery) could be slow; and if it toggles L→H too late, EDR could be an issue same as before.

Figure 14:
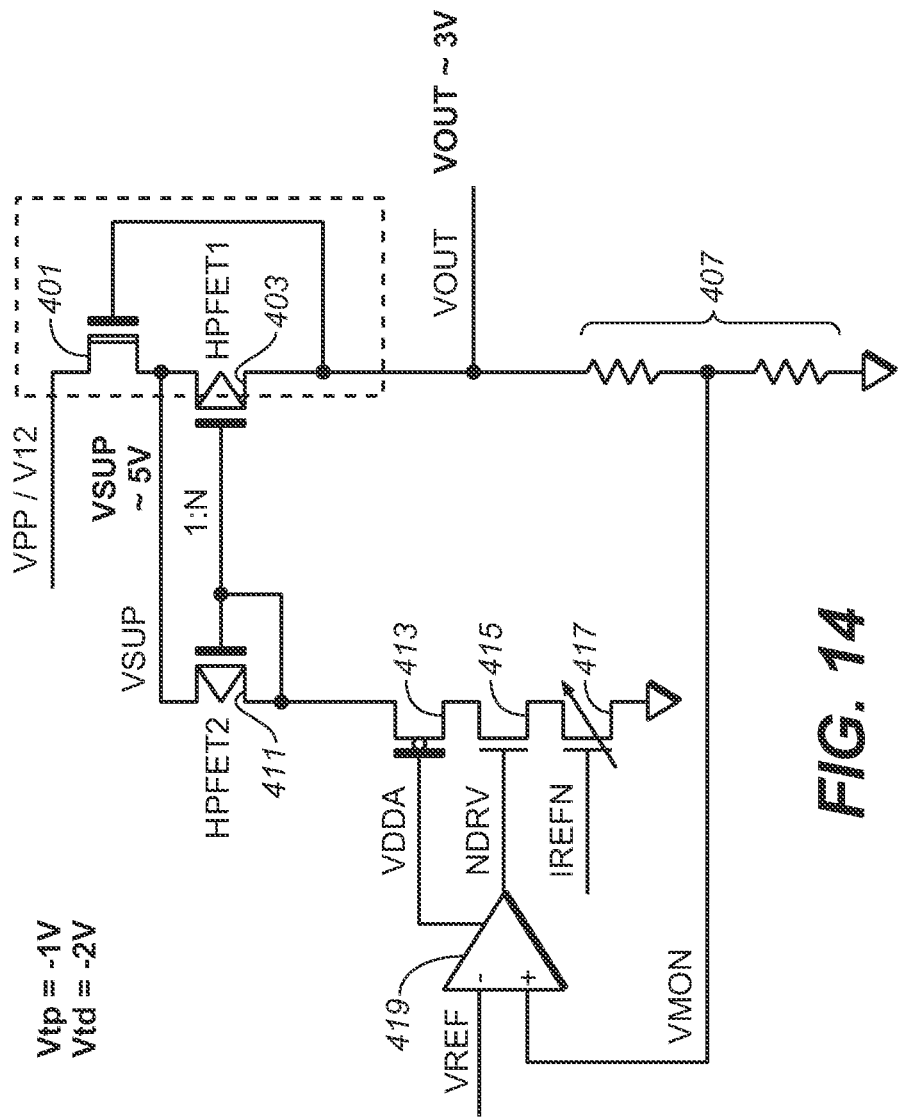
FIG. 14 illustrates an exemplary embodiment of a high voltage step-down regulator with breakdown protection.

To improve upon this situation, a primary aspect of this section introduces an HPFET current mirror based on a high voltage depletion type NFET to protect the output HPFET and to drive the output. FIG. 14 illustrates an exemplary embodiment.

The supply control elements of the circuit (411, 413, 415, 417, 419) shown on the left of FIG. 14 can be taken as the corresponding elements (311, 313, 315, 317) of FIG. 13. On the right side of the current mirror, a high voltage output transistor HPFET1 403 again supplies the output node. Between the high voltage VPP supply and HPFET1 403 and HPFET2 411, a high voltage depletion type NMOS 401 is connected so that part of the voltage drop between VPP and VOUT is now across this depletion device. The gate of the depletion device 401 is connected at the output node so that by using the output level as feedback to control internal supply voltage VSUP, the EDR concern is eliminated for the supply transistor HPFET1 403.

To the example of VPP=12V for the supply and a desired regulated low voltage level of VOUT ~3V, this will put the gate of the depletion device 401 at ~3V. HPFET1 403 and the depletion type NFET 401 both negative threshold devices, having respective threshold voltages of Vtp=−1V and Vtd=−2V, for example. As VSUP=VOUT+|Vtd|, this puts the internal supply node VSUP below the depletion type NFET 401 at VSUP ~5V, so that there is only a two volt drop across HPFET1 403. This arrangement allows for the output level to cover a wide range of voltages from VREF to the supply level without design rule (EDR) concerns.

Although described here in the context of its use on a non-volatile memory circuit, the techniques of this section are more generally applicable to step down regulators that could use protection from breakdown due to the voltage differences involved. The inclusion of a depletion device as illustrated in FIG. 14 by the element 401 can provide such protection by reducing the amount of voltage drop across the PFET 403 that supplies the load. The circuit of FIG. 14 differs from what is level shifters/switches that may use a somewhat similar arrangement in that in those cases the idea is to fully pass the voltage level across these devices to the output, where this is in response to an enable signal. In these level shifters/switches, the enable signal goes through to the output (and so to the gate) of the depletion device to improve response to a select/enable being asserted and then passes on the desired voltage from the input to the output. In contrast, the present techniques are directed at stepping down a high voltage to a regulated low voltage supply level.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A high voltage step-down regulator circuit to provide a regulated low voltage level from a high voltage supply level, comprising:
    a high voltage output transistor connected between the high voltage supply level and an output node;
    a depletion device through which the high voltage output transistor is connected to the high voltage supply level, wherein a control gate of the depletion device is connected to the output node, thereby reducing a voltage drop across the high voltage output transistor; and
    supply control circuitry connected to receive feedback from the output node and set the voltage level on the control gate of the high voltage output transistor to provide the regulated low voltage level on the output node based upon the feedback,
    wherein the supply control circuitry comprises:
        a voltage divider connected between the output node and ground;
        an operational amplifier having a first input connected to a node of the voltage divider and a second input connected to a reference voltage, wherein the voltage level on the control gate of the high voltage output transistor is set based on the output of the operational amplifier;
        a supply control transistor whose gate is connected to the output of the operational amplifier;
        a high voltage mirror transistor connected between the high voltage supply level and ground through the depletion device and the supply control transistor, respectively, and having a control gate commonly connected with the control gate of the high voltage output transistor to a node between the high voltage mirror transistor and the supply control transistor, and
        an adjustable current source connected between the supply control transistor and ground.

2. The high voltage step-down regulator circuit of claim 1, wherein the high voltage step-down regulator circuit is formed on a monolithic three-dimensional semiconductor memory device in which memory cells are arranged in multiple physical levels above a silicon substrate and comprise a charge storage medium.

3. The high voltage step-down regulator circuit of claim 2, wherein memory cells of the memory device are formed according to a NAND type architecture.

4. The high voltage step-down regulator circuit of claim 2, wherein the regulated low voltage level is used for unselected word lines during a sensing operation.

5. The high voltage step-down regulator circuit of claim 2, wherein the regulated low voltage level is used for unselected word lines during a programming operation.

6. The high voltage step-down regulator circuit of claim 2, wherein the regulated low voltage level is used for selected word lines during a sensing operation.

7. The high voltage step-down regulator circuit of claim 2, wherein the regulated low voltage level is used for select gates during a sensing operation.

8. The high voltage step-down regulator circuit of claim 2, wherein the regulated low voltage level is used for select gates during a programming operation.

9. A high voltage step-down regulator circuit to provide a regulated low voltage level from a high voltage supply level, comprising:
 a high voltage output transistor connected between the high voltage supply level and an output node;
 a depletion device through which the high voltage output transistor is connected to the high voltage supply level, wherein a control gate of the depletion device is connected to the output node, thereby reducing a voltage drop across the high voltage output transistor; and
 supply control circuitry connected to receive feedback from the output node and set the voltage level on the control gate of the high voltage output transistor to provide the regulated low voltage level on the output node based upon the feedback,
 wherein the supply control circuitry comprises:
  a voltage divider connected between the output node and ground;
  an operational amplifier having a first input connected to a node of the voltage divider and a second input connected to a reference voltage, wherein the voltage level on the control gate of the high voltage output transistor is set based on the output of the operational amplifier;
  a supply control transistor whose gate is connected to the output of the operational amplifier;
  a high voltage mirror transistor connected between the high voltage supply level and ground through the depletion device and the supply control transistor, respectively, and having a control gate commonly connected with the control gate of the high voltage output transistor to a node between the high voltage mirror transistor and the supply control transistor, and
  a high voltage NMOS transistor connected between the supply control transistor and the high voltage mirror transistor, wherein control gate of the high voltage mirror transistor is commonly connected with the control gate of the high voltage output transistor to a node between the high voltage mirror transistor and the high voltage NMOS transistor.

10. The high voltage step-down regulator circuit of claim 9, wherein the high voltage step-down regulator circuit is formed on a monolithic three-dimensional semiconductor memory device in which memory cells are arranged in multiple physical levels above a silicon substrate and comprise a charge storage medium.

11. A high voltage step-down regulator circuit to provide a regulated low voltage level from a high voltage supply level, comprising:
 a high voltage output transistor connected between the high voltage supply level and an output node;
 a depletion device through which the high voltage output transistor is connected to the high voltage supply level, wherein a control gate of the depletion device is connected to the output node, thereby reducing a voltage drop across the high voltage output transistor; and
 supply control circuitry connected to receive feedback from the output node and set the voltage level on the control gate of the high voltage output transistor to provide the regulated low voltage level on the output node based upon the feedback,
 wherein the supply control circuitry comprises:
  a voltage divider connected between the output node and ground;
  an operational amplifier having a first input connected to a node of the voltage divider and a second input connected to a reference voltage, wherein the voltage level on the control gate of the high voltage output transistor is set based on the output of the operational amplifier;
  a supply control transistor whose gate is connected to the output of the operational amplifier; and
  a high voltage mirror transistor connected between the high voltage supply level and ground through the depletion device and the supply control transistor, respectively, and having a control gate commonly connected with the control gate of the high voltage output transistor to a node between the high voltage mirror transistor and the supply control transistor, wherein the high voltage mirror transistor is sized smaller than the high voltage output transistor.

12. The high voltage step-down regulator circuit of claim 11, wherein the high voltage output transistor is a PFET device.

13. The high voltage step-down regulator circuit of claim 11, wherein the voltage difference between the high voltage supply level and the regulated low voltage level is 8 volts or more.

14. The high voltage step-down regulator circuit of claim 11, wherein the supply control circuitry comprises:
 a voltage divider connected between the output node and ground; and
 an operational amplifier having a first input connected to a node of the voltage divider and a second input connected to a reference voltage, wherein the voltage level on the control gate of the high voltage output transistor is set based on the output of the operational amplifier.

15. The high voltage step-down regulator circuit of claim 14, wherein the supply control circuitry further comprises:
 a supply control transistor whose gate is connected to the output of the operational amplifier; and
 a high voltage mirror transistor connected between the high voltage supply level and ground through the depletion device and the supply control transistor, respectively, and having a control gate commonly connected with the control gate of the high voltage output transistor to a node between the high voltage mirror transistor and the supply control transistor.

16. The high voltage step-down regulator circuit of claim 11, wherein the high voltage step-down regulator circuit is formed on a monolithic three-dimensional semiconductor memory device in which memory cells are arranged in multiple physical levels above a silicon substrate and comprise a charge storage medium.

17. The high voltage step-down regulator circuit of claim 16, wherein memory cells of the memory device are formed according to a NAND type architecture.

18. The high voltage step-down regulator circuit of claim 16, wherein the regulated low voltage level is used for unselected word lines during a sensing operation.

19. The high voltage step-down regulator circuit of claim 16, wherein the regulated low voltage level is used for unselected word lines during a programming operation.

20. The high voltage step-down regulator circuit of claim 16, wherein the regulated low voltage level is used for selected word lines during a sensing operation.

21. The high voltage step-down regulator circuit of claim 16, wherein the regulated low voltage level is used for select gates during a sensing operation.

22. The high voltage step-down regulator circuit of claim 16, wherein the regulated low voltage level is used for select gates during a programming operation.

* * * * *